(12) United States Patent
Hilton

(10) Patent No.: US 7,049,992 B1
(45) Date of Patent: May 23, 2006

(54) SAMPLE RATE DOUBLING USING ALTERNATING ADCS

(75) Inventor: Howard E. Hilton, Snohomish, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/977,833

(22) Filed: Oct. 29, 2004

(51) Int. Cl.
H03M 1/12 (2006.01)
H04B 1/10 (2006.01)

(52) U.S. Cl. .................... 341/155; 375/350

(58) Field of Classification Search ............... 341/155, 341/120, 152; 329/304, 323; 348/614; 375/219, 375/296, 350, 355; 379/406.08; 360/46; 708/313, 319
See application file for complete search history.

(56) References Cited

U.S. PATENT DOCUMENTS

| | | | |
|---|---|---|---|
| 4,755,761 A * | 7/1988 | Ray, Jr. ..................... 329/323 |
| 4,965,822 A * | 10/1990 | Williams ............... 379/406.08 |
| 5,233,549 A * | 8/1993 | Chinn ......................... 708/319 |
| 5,278,872 A * | 1/1994 | Greenberg ................... 375/350 |
| 5,335,194 A * | 8/1994 | Clayton et al. ............. 708/313 |
| 5,732,107 A * | 3/1998 | Phillips et al. ............. 375/296 |
| 5,825,242 A * | 10/1998 | Prodan et al. ............. 329/304 |
| 5,886,749 A * | 3/1999 | Williams et al. ........... 348/614 |
| 6,384,756 B1 * | 5/2002 | Tajiri et al. ................. 341/120 |
| 6,414,612 B1 * | 7/2002 | Quesenberry ............... 341/120 |
| 6,600,438 B1 | 7/2003 | Hilton ........................ 341/155 |
| 6,735,029 B1 * | 5/2004 | Seng et al. ................... 360/46 |
| 6,744,835 B1 * | 6/2004 | Panicker et al. ............ 375/355 |
| 6,795,494 B1 * | 9/2004 | Phanse et al. .............. 375/219 |
| 6,798,827 B1 * | 9/2004 | Phanse ....................... 375/219 |
| 6,885,330 B1 * | 4/2005 | Trotter et al. ............... 341/152 |

* cited by examiner

Primary Examiner—Patrick Wamsley

(57) ABSTRACT

One embodiment of the invention includes a system comprising an analog baseband signal input, a conversion circuit with N Analog to Digital Converters (ADCs) operable to receive the analog baseband signal, and a Finite Impulse Response (FIR) filter operable to receive outputs of the N ADCs and to produce a digital representation of the analog baseband signal corrected for a mismatch in the N ADCs.

18 Claims, 2 Drawing Sheets

US 7,049,992 B1

SAMPLE RATE DOUBLING USING ALTERNATING ADCS

BACKGROUND OF THE INVENTION

In the filed of signal receivers, converting both broadband and baseband analog signals to digital signals involves an inherent trade-off between Analog to Digital Converter (ADC) sample rate and accuracy. Designers are faced with the choice of using a faster ADC that may lack a high degree of accuracy or using a lower sample rate ADC that has more accuracy. Oftentimes, the choice is made for the designer because the frequency of the received signal, $F_{signal}$, dictates the minimum sample rate, $F_{sample}$, that must be used to avoid aliasing. Typically this would be $2F_{signal}=F_{sample}$.

One approach that has seen some success in the conversion of Intermediate Frequency (IF) signals is to use alternating ADCs that each sample at half of the desired sample rate (assuming that the bandwidth of the IF signal is less than or equal to double the first Nyquist intervals of each of the ADCs). First, the IF signal is converted into one In-Phase (I) and one Quadrature (Q) signal (i.e., I/Q baseband signals). The I and Q signals are then each digitized by one of a pair of alternating ADCs that sample at one half $F_{sample}$. Distortion is added to the signals because of non-ideal and non-matching frequency responses of the two ADCs. In fact, the frequency response mismatch of the two ADCs can eliminate much of the advantage of a two ADC system over a single ADC system.

In one solution, the I and Q signals are then processed by local oscillators that multiply the I digitized signal by a sequence of [1, −1, 1 . . . ] and multiply the Q digitized signal by a sequence of [j, −j, j . . . ]. This results in a clean, conceptual separation of I and Q samples between the real and imaginary paths for subsequent processing. The frequency response corruption of each ADC can then be associated with the real or imaginary data streams. A single Finite Impulse Response (FIR) filter is used to eliminate the corruption of the data paths, with the output of the filter being reassembled into one digital signal that includes all of the information of the original analog signal.

The conceptual separation of distortion into real and imaginary components provides the key to understanding that a single FIR filter can be implemented to correct for the frequency response mismatch of the two ADCs. However, the IF signal solution does not necessarily lead to a solution for correcting for frequency response mismatch between two ADCs in a system that digitizes a single analog baseband input signal. This is because a single analog baseband input signal cannot be separated into real and imaginary components.

BRIEF SUMMARY OF THE INVENTION

One embodiment of the invention includes a system comprising an analog baseband signal input, a conversion circuit with N Analog to Digital Converters (ADCs) operable to receive the analog baseband signal, and a Finite Impulse Response (FIR) filter operable to receive outputs of the N ADCs and to produce a digital representation of the analog baseband signal corrected for a mismatch in the N ADCs.

In another embodiment of the invention, correcting for frequency response mismatch in a dual-ADC system is accomplished by splitting the signal into even and odd paths, wherein the odd path signal is subjected to a time delay. The two paths are digitized by separate ADCs to produce even and odd digital representation components of the original analog baseband input signal. The even and odd components contain distortion from the frequency response mismatch between the two ADCs. To correct for the mismatch, the components are then input into a single FIR filter that applies 2×2 matrix filter taps. The result is corrected even and odd components that can be reassembled into a single digital signal that includes all of the information of the original analog baseband input signal.

DETAILED DESCRIPTION OF THE INVENTION

Figure 1:
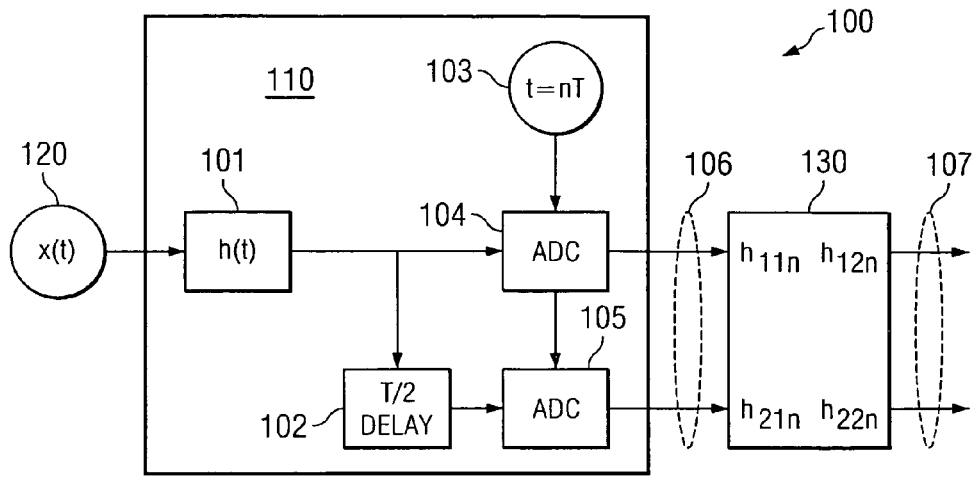
FIG. 1 is an illustration of one embodiment of the invention for performing sample rate doubling using alternating ADCs.

FIG. 1 is an illustration of one embodiment of the invention in which system 100 is shown for performing sample rate doubling using alternating Analog to Digital Converters (ADCs). In this example, input 120 is an analog baseband signal that is provided to circuit 101 for digital conversion. As with any circuit, circuit 110 includes an impulse response, illustrated by h(t) 101. Impulse response 101 is the response for ADCs 104 and 105, delay 102, and additional components of the circuit that are not shown. Although impulse response 101 is determined by the characteristics of the various components of circuit 110, it is illustrated as a separate component of circuit 110 for simplicity.

Input 120 is provided to circuit 110 and split into two paths. The top path leads to ADC 104. The bottom path leads to delay 102 and ADC 105. In this embodiment, ADCs 104 and 105 are both run by clock 103. Accordingly, while both paths convert signal 120 into a digital signal, the lower path subjects input 120 to a time delay. Conceptually, ADCs 104 and 105 are alternating so that, in a given clock cycle, together they produce a set of samples corresponding to one delay of zero and one delay of T/2. The result is that ADCs 104 and 105 operate respectively to produce even and odd digital representation components 106 of analog input signal 120. Neither component by itself represents all of the information contained in analog baseband signal input 120 because ADCs 104 and 105 each perform undersampling. This allows sampling where the a bandwidth of the analog baseband input signal is wider than the Nyquist band of either of the individual ADCs. However, taken together, components 106 will represent all of the information in analog baseband signal input 120 as long as each ADC 104 and 105 samples input 120 at least at half of the desired sample frequency.

Ideally, ADCs 104 and 105 sample analog baseband signal input 120 at exactly the same time and operate with exactly the same parameters. Practical embodiments, however, show some degree of frequency response mismatch. The result of frequency response mismatch is that when components 106 are assembled into a single digital signal, there will be some amount of information distortion. Therefore, the accuracy of the digital representation will be degraded.

Impulse response 101 includes the frequency response mismatch between ADCs 104 and 105, and it is possible to use impulse response 101 to design filter 130 to effectively correct for the mismatch. System 100 includes Finite Impulse Response (FIR) filter 130 operable to receive outputs 106 of ADCs 104 and 105, and to produce digital representation 107 of analog baseband signal input 120 corrected for the mismatch between ADCs 104 and 105.

A problem encountered in correcting for the frequency response mismatch between alternating ADCs is how to design a filter, such as FIR filter 130, that can account for the fact that each of the digital representation components 106 are not complete representations of analog baseband signal input 120. It is not as simple as putting a single filter behind each ADC 104 and 105. A single filter that receives only the even or odd components will not have enough information to correctly filter the component because there is an infinite combination of first and second Nyquist interval signals that could combine to produce the same sequence of samples that are found in that component. Therefore, the filter that is needed is one that receives and conditions both the even and odd sampled components. In other words, the filter cross-couples both the even and odd components to compute the linear combination of all samples to produce the correct even samples and the linear combination of all samples to produce the correct odd samples. FIR filter 130 provides such a solution by incorporating a sequence of 2×2 matrix filter taps that are each computed using even and odd components of system impulse response 101 and are each applied to even and odd components of representation 106.

The process of calculating the correct FIR filter taps will now be explored. The following equations treat each pair of even and odd digital representation components 106 as a two-element vector. Performing the calculations with vectors and matrices is done for the convenience of the notation, since system 100 uses alternating ADCs 104 and 105. Those of skill in the art will understand that the calculations can also be performed with time-varying, piecemeal functions that represent the alternating of ADCs 104 and 105.

The desired signal processing of analog baseband signal input signal 120, x(t), is given in Equation 1.

$$y_n = \begin{bmatrix} x(t) \otimes g(t) \\ x(t+T/2) \otimes g(t) \end{bmatrix}_{t=nT} \tag{1}$$

where T is the sampling period of each ADC 104 and 105, and g(t) is the impulse response of the desired filtering to be applied to the signal. This response, g(t), has a bandwidth of less than 1/T in order for the composite sample rate to eliminate aliasing. This may be implemented, for example, as a flat pass band for the first Nyquist interval of x(t) with a transition band that rolls off rapidly to filter out frequencies of the second Nyquist interval. The filtering represented by g(t) may be a user's ideal analog-to-digital conversion of analog baseband signal input signal 120, and it is usually chosen by the user.

However, the actual output signal 106 from circuit 110 (a dual-ADC front end) is represented by Equation 2:

$$x_n = \begin{bmatrix} x(t) \otimes h_1(t) \\ x(t) \otimes h_2(t) \end{bmatrix}_{t=nT} \tag{2}$$

where $h_1(t)$ is the impulse response from the input connector through even-sample ADC 104, and $h_2(t)$ is the impulse response from the input connector through odd-sample ADC 105. Splitting impulse response 101 into $h_1(t)$ and $h_2(t)$ is a way of adapting response 101 to the vector notation used herein. It also expresses that each of the two paths have individual impulse responses. It should be noted that, similar to Equation 1, the right hand side represents an array of discrete sample values. Further, the bandwidth of $h_1(t)$ and $h_2(t)$ is assumed to be less than 1/T.

The goal is to determine the appropriate calibration filter response, $q_n$, of filter 130. Equation 3 represents the relationship of $q_n$, $y_n$, and $x_n$. As shown below, Equation 3 can be manipulated to calculate $q_n$.

$$y_n = q_n \otimes x_n \tag{3}$$

Equation 3 can be rewritten as Equation 4 by explicitly writing out the convolution integrals:

$$\begin{bmatrix} \int_{\tau=-\infty}^{\infty} x(\tau)g(nT-\tau)d\tau \\ \int_{\tau=-\infty}^{\infty} x(\tau^1+T/2)g(nT-\tau^1)d\tau^1 \end{bmatrix} = q_n \otimes \begin{bmatrix} \int_{\tau=-\infty}^{\infty} x(\tau)h_1(nT-\tau)d\tau \\ \int_{\tau=-\infty}^{\infty} x(\tau)h_2(nT-\tau)d\tau \end{bmatrix} \tag{4}$$

where the new dummy integration variable $\tau=\tau'+\frac{1}{2}$. This does not change the integration result because of the infinite bounds. Similarly, the discrete sample data convolution summation can be written out explicitly, as in Equation 5.

$$\begin{bmatrix} \int_{\tau=-\infty}^{\infty} x(\tau)g(nT-\tau)d\tau \\ \int_{\tau=-\infty}^{\infty} x(\tau)g(nT+T/2-\tau)d\tau \end{bmatrix} = \\ \sum_{\tau=-\infty}^{\infty} q_m \begin{bmatrix} \int_{\tau=-\infty}^{\infty} x(\tau)h_1((n-m)T-\tau)d\tau \\ \int_{\tau=-\infty}^{\infty} x(\tau)h_2((n-m)T-\tau)d\tau \end{bmatrix} \tag{5}$$

The integration and summation can now be reordered. Also, since the dummy integration variable is the same for both elements of each vector, the integration can be performed with the integrand being a scalar multiplied by a vector, as in Equation 6.

$$\int_{\tau=-\infty}^{\infty} x(\tau) \begin{bmatrix} g(nT-\tau) \\ g(nT+T/2-\tau) \end{bmatrix} d\tau = \\ \int_{\tau=-\infty}^{\infty} x(\tau) \sum_{\tau=-\infty}^{\infty} q_m \begin{bmatrix} h_2((n-m)T-\tau) \\ h_2((n-m)T-\tau) \end{bmatrix} d\tau \tag{6}$$

It is desirable to enforce Equation 6 to hold true for any arbitrary input signal x(t) and for all values of n and t. Accordingly, this is relationship is expressed as Equation 7.

$$\begin{bmatrix} g(nT-\tau) \\ g(nT+T/2-\tau) \end{bmatrix} = \sum_{\tau=-\infty}^{\infty} q_m \begin{bmatrix} h_2((n-m)T-\tau) \\ h_2((n-m)T-\tau) \end{bmatrix} \quad (7)$$

Because of the bandwidth limits on the filters, the impulse responses g, $h_1$, and $h_2$, are all fully specified with time samples spaced at intervals of T/2. Thus, the constraint above need only be evaluated at discrete time points t=0 and t=T/2. The constraint at both of these time points can be written into a single matrix equation, as in Equation 8.

$$\begin{bmatrix} g(nT) & g(nT-T/2) \\ g(nT+T/2) & g(nT) \end{bmatrix} = \quad (8)$$

$$\sum_{\tau=-\infty}^{\infty} q_m \begin{bmatrix} h_1((n-m)T) & h_1((n-m)T-T/2) \\ h_2((n-m)T) & h_2((n-m)T-T/2) \end{bmatrix}$$

It is now useful to define the following matrices in Equations 9 and 10.

$$h_n = \begin{bmatrix} h_1(nT) & h_1(nT-T/2) \\ h_2(nT) & h_2(nT-T/2) \end{bmatrix} \quad (9)$$

$$g_n = \begin{bmatrix} g(nT) & g(nT-T/2) \\ g(nT+T/2) & g(nT) \end{bmatrix} \quad (10)$$

The desired set of coefficient matrices, $q_m$, is found by solving a matrix convolution equation, as in Equation 11.

$$g_n = \sum_{\tau=-\infty}^{\infty} q_m \, h_{n-m} \quad (11)$$

This solution can be approached by transforming the matrices to the frequency domain in order to avoid performing convolution. The length of the transform, N, should be long enough to encompass the complete impulse responses g, $h_1$, and $h_2$.

$$\sum_{n=0}^{N-1} e^{\frac{-j2\pi kn}{N}} g_n = \sum_{\tau=-\infty}^{\infty} q_m e^{\frac{-j2\pi km}{N}} \sum_{n=0}^{N-1} e^{\frac{-j2\pi k(n-m)}{N}} h_{n-m} \quad (12)$$

Substitute p=n−m. This changes the limits on the rightmost summation.

$$\sum_{n=0}^{N-1} e^{\frac{-j2\pi kn}{N}} g_n = \sum_{\tau=-\infty}^{\infty} q_m e^{\frac{-j2\pi km}{N}} \sum_{p=-m}^{N-1-m} e^{\frac{-j2\pi kp}{N}} h_p \quad (13)$$

The limits on the rightmost summation may be adjusted to be independent of m if the value being summed is periodic in N. This is accomplished by replacing h with h' which is a cyclic version of the finite duration impulse response, as expressed in Equation 14.

$$h'_p = h_{p \bmod N} \quad (14)$$

Making this substitution and limiting the number of filter taps gives Equation 15. Note that the filter taps are non-zero only in the range 0 through N−1, such that the non-zero range is implemented cyclically in Equation 15. Thus, N must be chosen to be large enough to encompass the complete compensation filter impulse response, $q_m$. In general this will be somewhat longer than the g and h responses. Making N too small will limit the degrees of freedom needed to produce a good calibration response.

$$\sum_{n=0}^{N-1} e^{\frac{-j2\pi kn}{N}} g_n = \sum_{m=0}^{N-1} e^{\frac{-j2\pi km}{N}} q_m \sum_{p=0}^{N-1} e^{\frac{-j2\pi kp}{N}} h'_p \quad (15)$$

Each of the summations in Equation 15 represents a Fourier transform. Using capitals letters to denote the transforms yields Equation 16.

$$G_k = Q_k H_k \quad (16)$$

Equation 16 can be manipulated to solve for the frequency response of the desired calibration filter, as in Equation 17. Note that the transformed matrix elements are complex, so the indicated multiplication requires complex operations. Also, note that since the original time domain matrices are real, the transformed matrices have conjugate symmetry with respect to the k index modulo N. This fact can be utilized to reduce the variable storage and computation time.

$$Q_k = G_k H_k^{-1} \quad (17)$$

To get the impulse response now requires taking the inverse Fourier transform, as in Equation 18.

$$q_m = \sum_{k=0}^{N-1} e^{\frac{-j2\pi km}{N}} Q_k \quad (18)$$

The output, $q_m$, is a sequence of N 2×2 matrices that is cycled through continuously by FIR filter 130. Each of the individual matrices is a filter tap to be used by FIR filter 130 to correct for the mismatch of ADCs 104 and 105. As mentioned above with regard to Equation 6, $q_m$ will hold for other signals that do not exceed the Nyquist frequency, 1/T.

Figure 2:
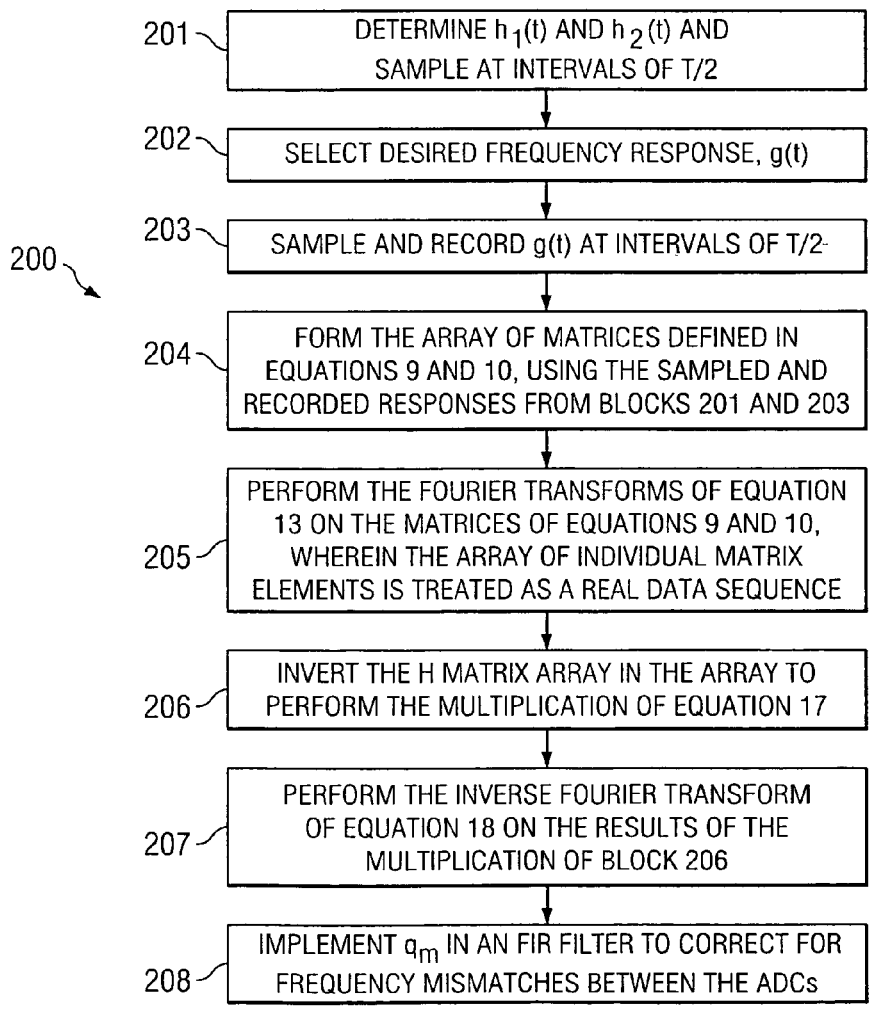
FIG. 2 is a flowchart of one embodiment of the invention for correcting for ADC mismatch.

FIG. 2 is a flowchart embodiment showing method 200 for correcting for ADC mismatch. Process 201 determines $h_1(t)$ and $h_2(t)$. Various ways exist to determine $h_1(t)$ and $h_2(t)$. For example, a well-controlled, known test input may be used as the analog baseband signal input for circuit 110 (FIG. 1). The outputs of ADCs 104 and 105 are sampled and recorded at intervals of T/2. Substituting these values into Equation 2 above will yield a relation that may be manipulated to solve for discrete values of $h_1(t)$ and $h_2(t)$. Impulse responses $h_1(t)$ and $h_2(t)$ represent not only the impulse response of circuit 110, but also the time offset error between ADCs 104 and 105.

Process 202 selects a desired frequency response, g(t). The desired frequency response is one wherein the ADCs have little or no frequency response mismatch, and it may even be mathematically ideal, theoretically eliminating mismatch totally.

Process 203 samples and records the desired frequency response at intervals of T/2. This step puts the frequency response into a discrete form that can be used in Equations 4–18 above.

Process 204 forms the array of matrices defined in Equations 9 and 10, using the sampled, recorded responses from blocks 201 and 203.

Process 205 performs the Fourier Transforms of Equation 13 on the matrices of Equations 9 and 10, wherein the array of individual matrix elements is treated as a real data sequence. This yields the frequency domain matrices of Equation 16.

Process 206 inverts each H matrix array in the array to perform the multiplication of Equation 17. This step is performed matrix-by-matrix across the entire array of matrices.

Process 207, performs the inverse Fourier Transform of Equation 18 on the results of the step of block 206. The array of individual matrix elements is treated as a complex data sequence for the inverse Fourier Transform. This step yields the array of vectors, $q_m$.

Process 208 implements $q_m$ in FIR filter 130 to correct for frequency response mismatches between ADCs 104 and 105 (all of FIG. 1). Accordingly, any analog baseband input signal 120, which does not exceed the Nyquist frequency of 1/T, may be input into circuit 110, conditioned by filter 130, and output as an accurate digital representation 107 of that original analog input signal 120.

Figure 3:
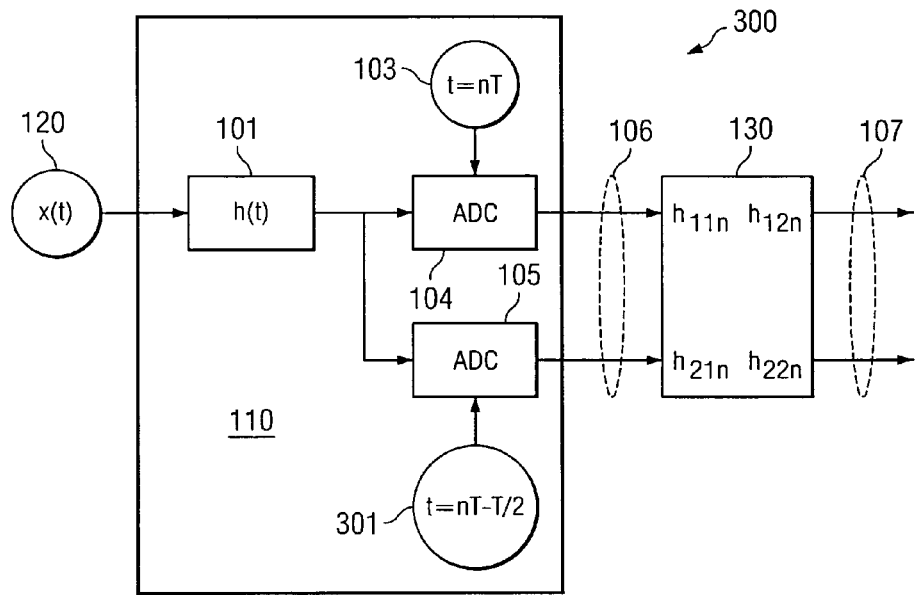
FIG. 3 is an illustration of one embodiment of the invention for performing sample rate doubling using alternating ADCs.

FIG. 3 is one embodiment of system 300 for performing sample rate doubling using alternating ADCs. It is similar to system 100, but instead of employing a delay element (such as element 102 of FIG. 1), system 300 uses advanced (or, alternatively, delayed) clock 301. The result is the same as in system 100—even and odd digital representation components 106 are produced at the outputs of ADCs 104 and 105. The invention is not limited to any particular process of producing even and odd digital representation components of an input analog baseband signal, and other alternative embodiments are within the scope of the invention. Even and odd digital representation components are one example of a more general complementary relationship between sampled digital components when exactly two sampled components exist. As explained below, the complementary relationship may be generalized to encompass embodiments that include more than two sampled digital components.

The above example embodiments utilize an FIR filter with 2×2 matrix taps. The present invention, however, may be expanded to cover embodiments wherein the filter employs larger matrix taps.

Figure 4:
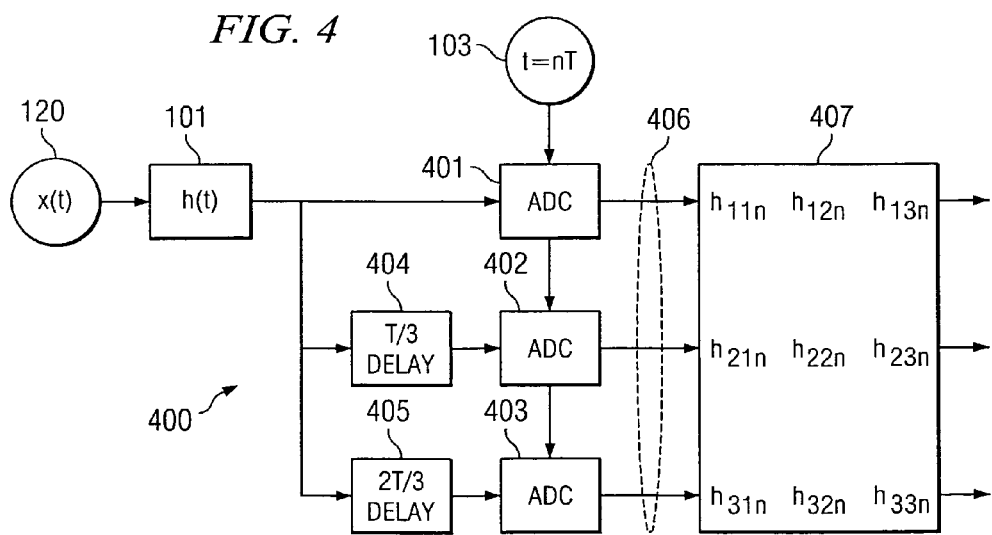
FIG. 4 is an illustration of one embodiment of the invention for performing sample rate tripling using three ADCs.

FIG. 4 is one embodiment of system 400 for performing sample rate tripling using three ADCs 401–403. Just as in the last examples, wherein the rate of sampling of a circuit is doubled by using two ADCs, the rate of sampling may be tripled by employing three ADCs in the arrangement shown. ADC 401 has zero delay at its input, while ADC 402 has T/3 delay 405 to its input, and ADC 403 has 2T/3 delay 405 to its input. ADCs 401–403 are conceptually cyclic, so that, in a given clock cycle, together they produce a set of samples that includes a sample delayed by zero, a sample delayed by T/3, and a sample delayed by 2T/3.

It can be seen that, rather than using even and odd digital representation components (such as components 106 of FIG. 1), system 400 uses three complementary components 406 that are delayed in a manner analogous to the delay in the two-ADC embodiments above. FIR filter 407, in this case, is a 3×3 filter. The computation of the matrix filter taps is similar to that of the 2×2 matrix taps, such that Equations 3, 11, and 16–18 hold true, however the intermediate calculation equations must be adapted for use of 3-element vectors and 3×3 matrices.

Other multiple-ADC embodiments are possible and are within the scope of the invention. In fact, the number of ADCs may be increased to N ("N" is not necessarily the same as that used in Equation 14, above), wherein the FIR filter applies N×N matrix taps to complementary digital representation components to correct for mismatch of the ADCs.

It should be noted that the computation of the taps of filter 130 is performed using matrices and vectors, effectively representing the even and odd samples as pairs that have been taken simultaneously and the filter coefficients as sets of four coefficients that are applied simultaneously. From another point of view, ADCs 104 and 105 (of FIG. 1) may be seen as taking samples at alternating times during time periods, T, with filter 130 (of FIG. 1) applying coefficients to even and odd samples at alternating times. This can be represented as time-varying, piecemeal equations, wherein filter 130 applies one set of coefficients during certain times to the even components and other sets of coefficients at other times to the odd components. Applications using either view are within the scope of the various embodiments, and those of skill in the art will understand that the two approaches are mathematically equivalent.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for digitizing an analog baseband signal comprising:
   receiving the analog baseband signal into a conversion circuit with N Analog to Digital Converters (ADCs); and
   correcting for a mismatch in the N ADCs by applying a Finite Impulse Response (FIR) filter to the outputs of the ADCs, wherein the FIR filter includes a plurality of N×N matrix filter taps.

2. The method of claim 1 further comprising:
   determining and sampling a transfer function of the conversion circuit;
   selecting and sampling a desired frequency response;
   forming an array of matrices of the samples of the transfer function and an array of matrices of the samples of the desired frequency response;
   performing a Fourier Transform on said arrays;
   multiplying the transformed array of matrices of samples of the desired frequency response with an array of inverted matrices of samples of the transfer function, matrix-by-matrix;
   performing an inverse Fourier Transform on the array of matrices that results from the multiplying step; and implementing the result of the inverse Fourier Transform in the FIR filter.

3. The method of claim 2 wherein determining and sampling a transfer function of the conversion circuit comprises:
   inputting a known signal to the circuit and recording the output thereof;
   determining the transfer function from the output and the known input; and
   generating discrete samples of the transfer function.

4. The method of claim 2 wherein the desired frequency response is a flat pass band for a first Nyquist interval of the analog baseband signal with a transition band that rolls off rapidly.

5. The method of claim 1 wherein said conversion circuit includes two ADCs, and the FIR filter includes 2×2 matrix filter taps.

6. The method of claim 1 wherein said conversion circuit includes three ADCs, and the FIR filter includes 3×3 matrix filter taps.

7. The method of claim 1 further comprising outputting a digital signal that is a representation of the analog baseband signal.

8. The method of claim 1 wherein receiving an analog baseband signal into a conversion circuit comprises splitting the analog baseband signal into N complementary paths, each path including a different time delay and one of the N ADCs.

9. A system comprising:
   an analog baseband signal input;
   a conversion circuit with N Analog to Digital Converters (ADCs) operable to receive the analog baseband signal; and
   a Finite Impulse Response (FIR) filter operable to receive outputs of the N ADCs and to produce a digital representation of the analog baseband signal corrected for a mismatch in the N ADCs, wherein the FIR filter applies filter taps to the outputs of the ADCs, and wherein the filter taps are computed from a transfer function of the circuit and a desired frequency response.

10. The system of claim 9 wherein a bandwidth of the analog baseband input signal is wider than a Nyquist band of any of the individual ADCs.

11. The system of claim 10 wherein the FIR filter applies 3×3 matrix taps to the outputs of the ADCs.

12. The system of claim 10 wherein the conversion circuit includes a non-zero delay element before one of the ADCs.

13. The system of claim 9 wherein the mismatch includes a frequency response mismatch and a time offset error.

14. The system of claim 9 wherein the conversion circuit includes a delayed clock coupled to one of the ADCs.

15. A conversion circuit comprising:
   means for producing complementary digital representation components of an analog baseband signal; and
   means for applying a plurality of filter taps to the complementary components for correcting for a mismatch in said producing means, wherein said correcting means comprises a Finite Impulse Response (FIR) filter for applying N×N matrix filter taps to the outputs of a plurality of ADCs.

16. The system of claim 15 wherein said producing means comprises:
   a plurality of Analog to Digital Converters (ADCs), each of said ADCs arranged for receiving the analog baseband signal with a different delay.

17. The system of claim 15 wherein said producing means comprises two ADCs producing even and odd digital representation components of said analog baseband signal.

18. The system of claim 15 wherein said producing means comprises a transfer function that includes the mismatch.

* * * * *

UNITED STATES PATENT AND TRADEMARK OFFICE
CERTIFICATE OF CORRECTION

PATENT NO. : 7,049,992 B1 Page 1 of 1
APPLICATION NO. : 10/997833
DATED : May 23, 2006
INVENTOR(S) : Hilton It is certified that error appears in the above-identified patent and that said Letters Patent is hereby corrected as shown below:

On the face page, in "Primary Examiner", in column 2, line 1, after "Patrick" insert -- G. --.

Signed and Sealed this

Twelfth Day of September, 2006

JON W. DUDAS
*Director of the United States Patent and Trademark Office*